US006717047B2

(12) United States Patent
Haselby et al.

(10) Patent No.: US 6,717,047 B2
(45) Date of Patent: Apr. 6, 2004

(54) EMI ENCLOSURE HAVING A FLEXIBLE CABLE SHIELD

(75) Inventors: Jeffrey T. Haselby, Dallas, TX (US); Eric C. Peterson, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/940,399

(22) Filed: Aug. 27, 2001

(65) Prior Publication Data

US 2003/0037942 A1 Feb. 27, 2003

(51) Int. Cl.[7] ................................................. H01B 7/00
(52) U.S. Cl. ............................ 174/35 R; 174/35 MS; 174/152 G
(58) Field of Search ........................ 174/35 R, 35 MS, 174/356 GC, 50.52, 50.59, 51, 52.1, 65 R, 152 G, 153 G; 361/601, 724, 816, 818, 641

(56) References Cited

U.S. PATENT DOCUMENTS

| | | | | |
|---|---|---|---|---|
| 4,349,241 A | * | 9/1982 | Juris et al. | 439/88 |
| 4,791,236 A | | 12/1988 | Klein et al. | 174/36 |
| 4,900,877 A | * | 2/1990 | Dubrow et al. | 174/35 GC |
| 5,126,507 A | * | 6/1992 | Kirma | 174/2 |
| 5,136,119 A | * | 8/1992 | Leyland | 174/35 R |
| 5,357,049 A | | 10/1994 | Plummer, III | 174/36 |
| 5,391,838 A | | 2/1995 | Plummer, III | 174/36 |
| 5,436,803 A | | 7/1995 | Annis et al. | 361/818 |
| 5,532,429 A | | 7/1996 | Dickerson et al. | 174/36 |
| 5,545,844 A | * | 8/1996 | Plummer et al. | 174/35 MS |
| 5,597,979 A | * | 1/1997 | Courtney et al. | 174/35 R |
| 5,717,576 A | * | 2/1998 | Van Doeselaar et al. | 361/816 |
| 5,748,449 A | * | 5/1998 | Tahmassebpur | 361/753 |
| 5,981,877 A | * | 11/1999 | Sakata et al. | 174/153 G |
| 6,064,000 A | | 5/2000 | Kim | 174/36 |
| 6,225,565 B1 | * | 5/2001 | Prysner | 174/120 SC |
| 6,288,329 B1 | * | 9/2001 | Kopp et al. | 174/35 R |
| 6,294,729 B1 | * | 9/2001 | Kaplo | 174/35 GC |

OTHER PUBLICATIONS

The Zippertubing Company, Z–Shield product sheets, Sep. 28, 2000, pp. 1–3.
The Zippertubing Company, "Conductive Fabrics", Jan. 5, 2001, pp. 1–3.

* cited by examiner

Primary Examiner—Dean A. Reichard
Assistant Examiner—Jinhee Lee

(57) ABSTRACT

An electromagnetic enclosure is provided that includes an opening for allowing one or more cables to pass through. The opening is enclosed with a flexible cable shield that has an electrically conductive inner surface. To reduce electromagnetic interference, the flexible cable shield is adjustably closable to surround the one or more cables. With the present invention, shielding radiation around an opening in an enclosure and around any number of cables can be easily done.

20 Claims, 4 Drawing Sheets

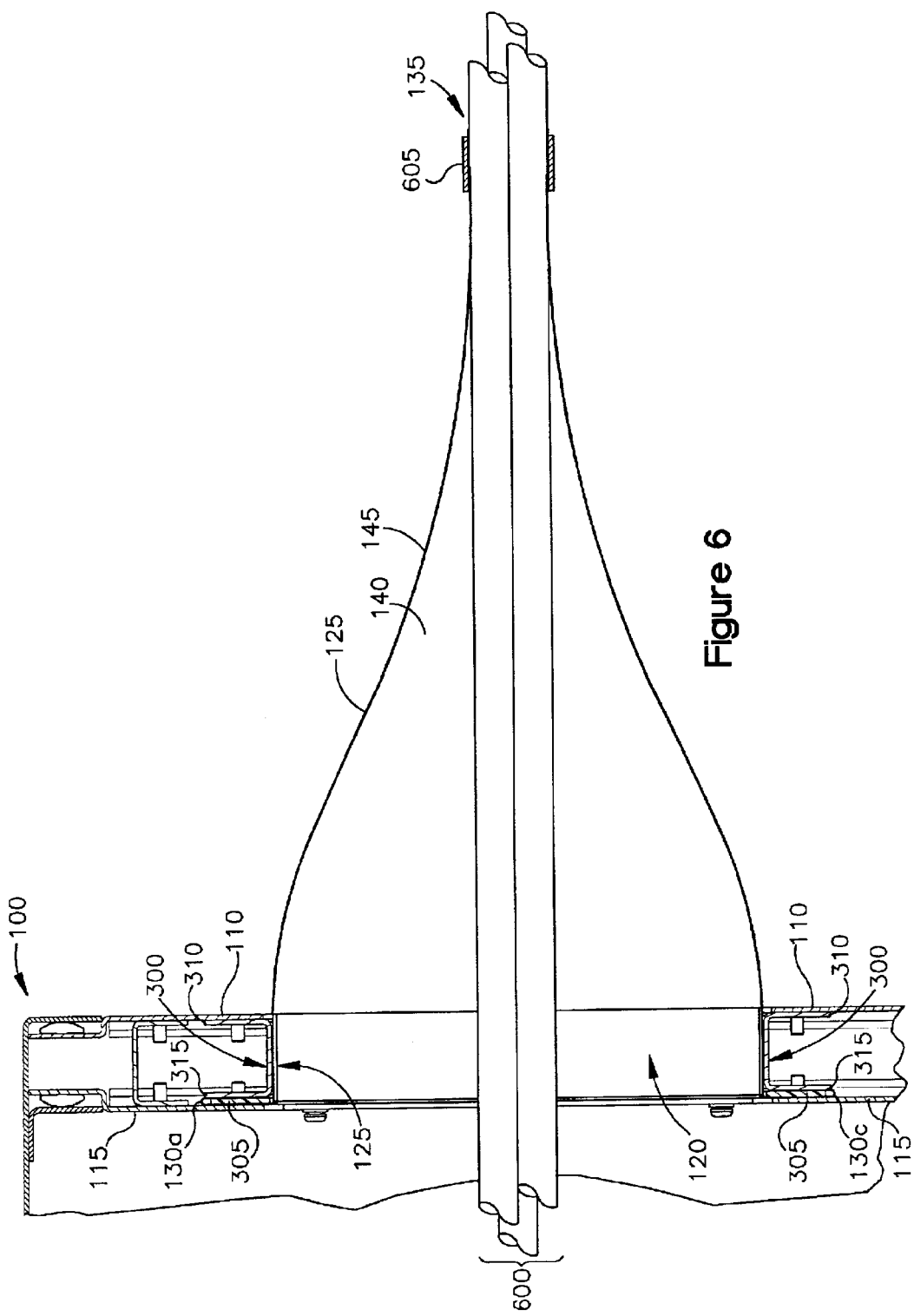

EMI ENCLOSURE HAVING A FLEXIBLE CABLE SHIELD

FIELD OF THE INVENTION

The invention relates to the electromagnetic interference (EMI) shielding arts. It finds particular application to an enclosure for an electronic device where the enclosure includes a flexible cable shield. It will be appreciated that the present invention will find application in any electronic system where shielding of EMI is desired including mainframe computers, network servers and the like.

BACKGROUND OF THE INVENTION

Electromagnetic interference (EMI) is a common problem faced during the operation of electronic equipment. EMI is unwanted electromagnetic energy entering or emitting from a specific piece of electronic equipment, thereby causing interference. EMI can cause that piece of electronic equipment or electronic equipment nearby to function improperly or to not function at all.

Typically, electronic equipment is housed within a metallic enclosure to help reduce EMI problems. Metallic materials are electrically conductive which serve to block EMI. However, joints or other openings in the enclosure tend to provide a source of radiation leakage and thus cause a reduction in shielding effectiveness. Conventionally, this reduction has been ameliorated by the use of electrically conductive compliant gasket material trapped between the lid or panel and the rest of the enclosure. When the enclosure has cables passing though an opening, a conduit was typically provided to enclose the opening and the cables. Prior art conduits were made of stiff metal that were difficult to work with and required additional tools to install and configure to various cable sizes.

The present invention provides a new and useful enclosure that cures the above problems and others.

SUMMARY OF THE INVENTION

According to the present invention, an enclosure is provided that includes a housing that reduces electromagnetic interference. The housing includes an opening to allow one or more cables to pass therethrough. A flexible cable shield, formed as a conduit, has a first and a second end. The cable shield has a inner surface formed of an electrically conductive flexible material that reduces electromagnetic interference. The first end is secured to the enclosure and encloses the opening. The second end is adjustably closable to closely surround one or more cables passing therethrough causing the inner surface of the flexible cable shield to contact the one or more cables.

One advantage of the present invention is that installing and shielding different quantities and/or sizes of cables in an enclosure is easily performed.

Still further advantages of the present invention will become apparent to those of ordinary skill in the art upon reading and understanding the following detailed description of the preferred embodiments.

BRIEF DESCRIPTION OF THE DRAWINGS

In the accompanying drawings which are incorporated in and constitute a part of the specification, embodiments of the invention are illustrated, which, together with a general description of the invention given above, and the detailed description given below, serve to example the principles of this invention.

FIG. 6 is a cross-section view of the cable shield being closed around cables in accordance with the present invention.

DETAILED DESCRIPTION OF ILLUSTRATED EMBODIMENT

The following includes definitions of exemplary terms used throughout the disclosure. Both singular and plural forms of all terms fall within each meaning:

"Electromagnetic interference" also referred to as "EMI", as used in this disclosure, is understood to refer to electromagnetic emission and radiation that includes both electromagnetic interference (EMI) and radio-frequency interference (RFI). It also refers to other types of radiation that can interfere with the operation of nearby electrical equipment as know to those skilled in the art.

"Resilient", as used in this disclosure, is understood to refer a characteristic of a material that is deformable and capable of withstanding shock without permanent deformation or rupture. It also includes having a tendency to recover from or adjust to a change in shape.

"Conduit", as used in this disclosure, is understood to refer an enclosed channel through which something may pass. The conduit includes any desired cross-sectional shape or configuration such as round, elliptical, flat, square, rectangular, triangular, other shapes or combinations of shapes at different points along the conduit.

Figure 1:
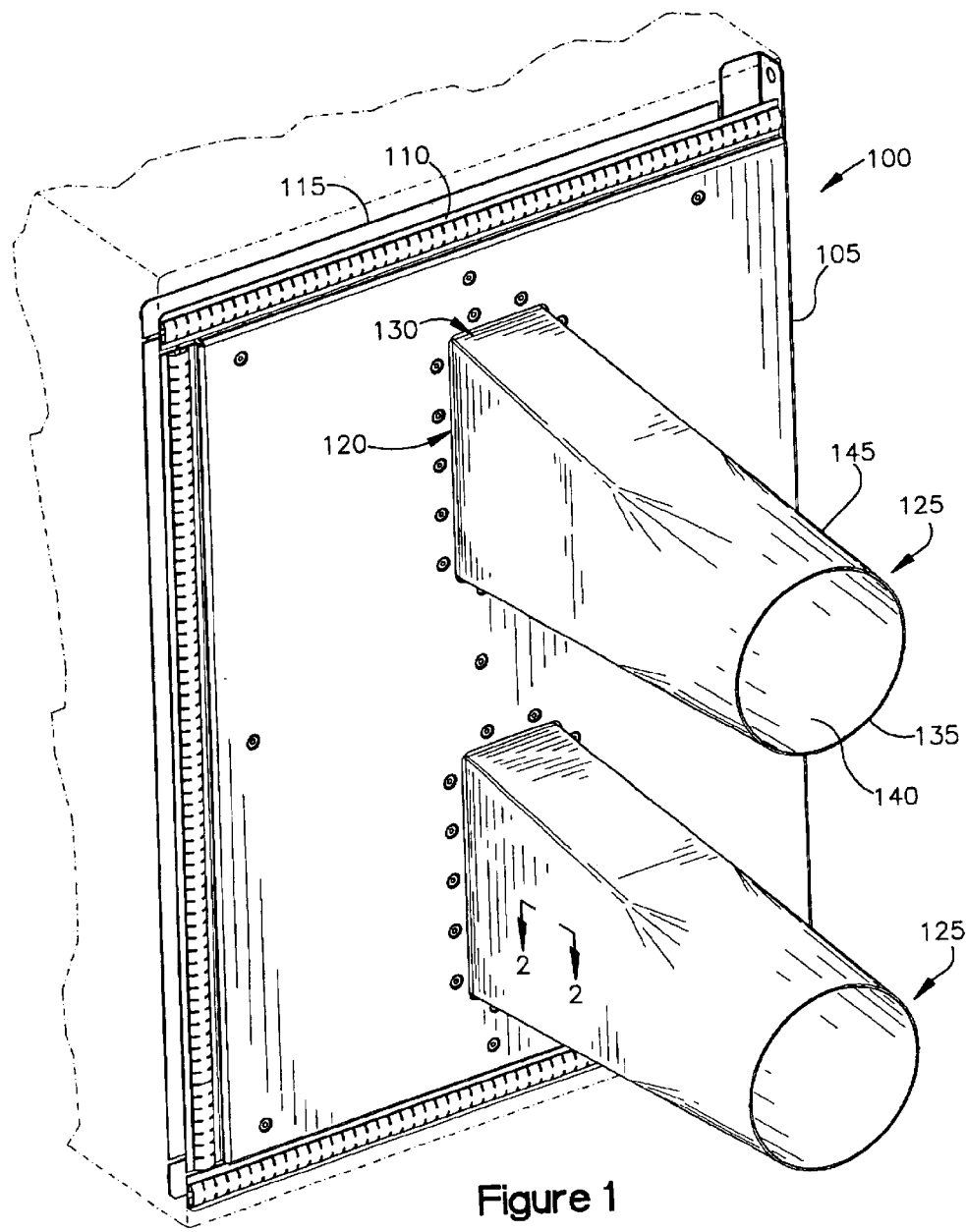
FIG. 1 is an exemplary perspective view of an enclosure with two flexible cable shields in accordance with the present invention.

Illustrated in FIG. 1 is an enclosure 100 that is used to enclose electrical devices to reduce electromagnetic interference (EMI) to and/or from the electronic device, such as a central processing unit. The enclosure 100 includes a housing 105 formed of one or more walls made of an electrically conductive material, for example, sheet metal. As shown, the wall is a two panel wall where a first panel 110 and a second panel 115 are secured together. It will be appreciated that any number of panels can be used to form the enclosure walls including one panel. Once the enclosure 100 is installed in a product enclosing an electronic device (s) therein, the enclosure reduces the transmission of electromagnetic interference to and from the enclosed device. Exemplary products that the enclosure can be used in include a mainframe computer, network server or other electronic systems.

Figure 5:
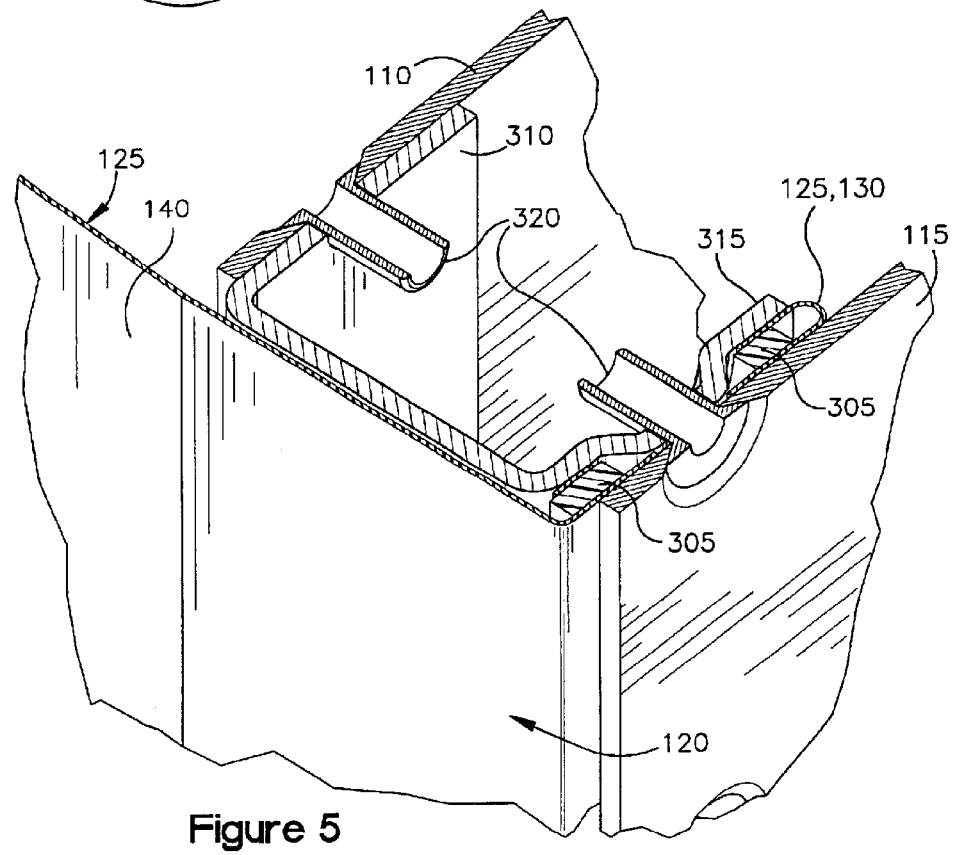
FIG. 5 is a cross-section view of the cable shield attached to the enclosure wall in accordance with the present invention.

The enclosure 100 is constructed to minimize the number of openings in the enclosure since an opening may allow EMI to leak through. However, certain enclosed electrical devices have one or more cables connected to them in order to transmit and receive signals from other electronic devices. To allow one or more cables to enter the enclosure 100, an opening 120 is formed through the enclosure which is best seen in FIG. 5. To prevent passage of electromagnetic interference through the opening 120, a flexible cable shield 125 is attached to the enclosure 100. In particular, the flexible cable shield 125 is a conduit and has a first end 130 that surrounds the opening 120 and is secured to the enclosure 100 to minimize leakage of electromagnetic interference. The flexible cable shield 125 extends out from the enclosure 100 and terminates at a second end 135 that is open. Although FIG. 1 is illustrated with two cable shields 125, it should be appreciated that any number of cable shields can be attached to the enclosure 100 including one shield.

The flexible cable shield 125 is formed of a flexible, electrically conductive fabric 140 that forms the inner surface of the cable shield 125. A flexible, electrically non-conductive outer layer 145 is bonded to the conductive fabric 140 to provide support to the fabric 140. The non-conductive layer 145 is, for example, neoprene or any desired polyurethane, elastomer, foam, cellular structured material, synthetic rubber or the like that is flexible and resilient.

The electrically conductive fabric 140 is, for example, identified by the trademark Z-Cloth® made by the Zippertubing Company of Los Angeles, Calif. This material is a woven substrate of polyester fabric, which is subjected to an electro-less plating process. The fabric is chemically plated with copper, nickel or a combination of both to produce conductive fibers. The type of metal and depth of plating determine the fabric's inherent electrical conductivity. Density of weave, combined with fiber conductivity, determines the overall surface resistively and shielding effectiveness.

The conductive fibers of the fabric 140 can be other types of metal fibers, metal alloy fibers, metallized synthetic fibers, such as metal plated nylon fibers, or the like. The conductive fibers are embedded in or coated on the fabric 140 in an amount sufficient to form an electrically conducting layer while also maintaining flexibility of the fabric 140. This yields a conductive fabric which is flexible in three dimensions. With these properties, the flexible cable shield 125 is adjustable, for example by squeezing, to closely surround and contact any number of cables or cable sizes to minimize electromagnetic interference.

Figure 2:
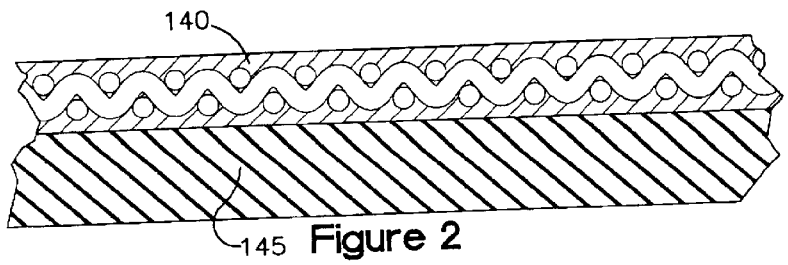
FIG. 2 is a cross-section view of the cable shield showing a two layer structure in accordance with the present invention.

Illustrated in FIG. 2 is a cross-section view of the shield 125 showing a two layer structure. An example of a material with both the inner layer 140 and outer layer 145 as described above is product number Z-3250CN, identified by the trademark Z-Shield®, made by the Zippertubing Company of Los Angeles, Calif. Z-3250CN is a combination of a polyurethane film 145 bonded to a metallized fabric 140. Of course, the shield 125 can be made with any number of layers including one layer.

Figure 3:
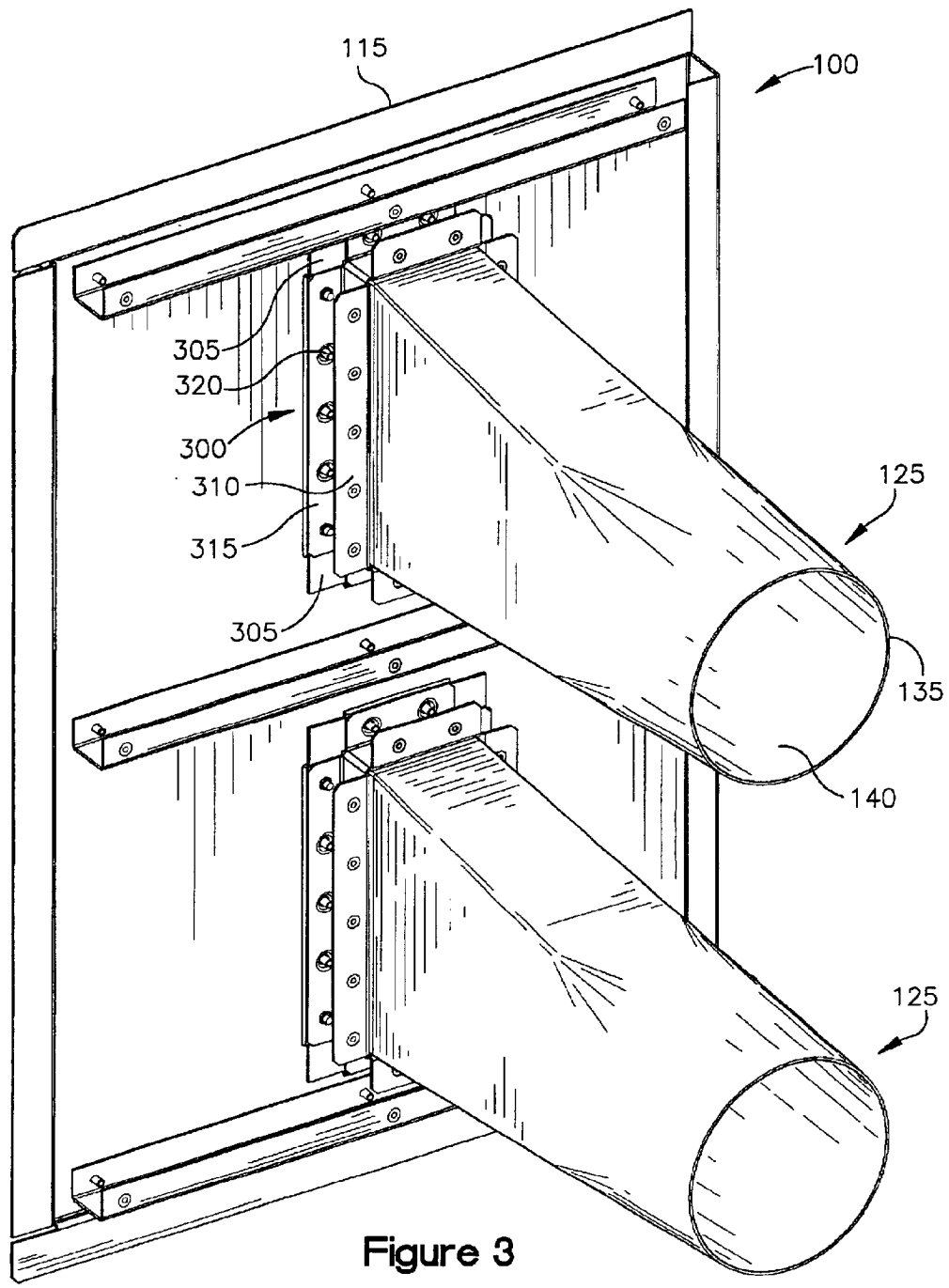
FIG. 3 is an exemplary view of FIG. 1 with the front wall panel removed.
Figure 4:
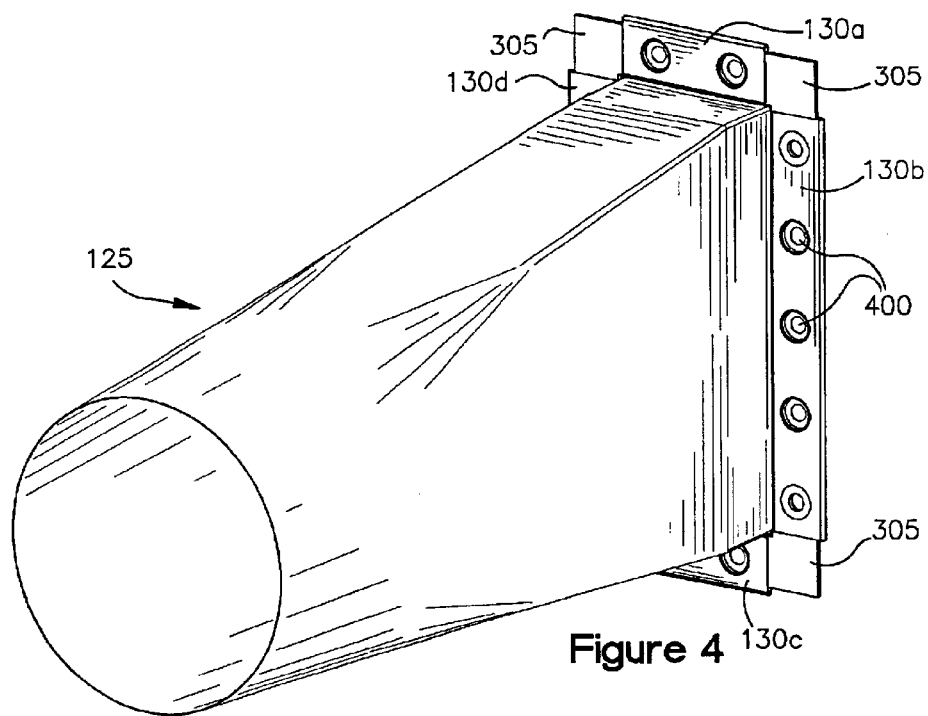
FIG. 4 illustrates the attachment end of the cable shield formed into flaps that fold around a gasket in accordance with the present invention.

With reference to FIG. 3, the wall of the enclosure 100 is shown with the first panel 110 removed. A bracket 300 supports and secures the first end of the flexible cable shield 125 to the panel wall 115. The bracket is made from an electrically conductive material, for example metal. To minimize any openings through which EMI may leak, a gasket 305 surrounds the cable opening 120 and is positioned against the cable shield's first end 130. To create a flat, attachable surface from the shield 125, the end 130 is cut in one or more locations. As best seen in FIG. 4, the cuts create one or more flaps such as flaps 130a, 130b, 130c and 130d. Of course, any number of flaps can be made. The first end 130 is secured to the gasket 305 by, for example, folding the flaps around the gasket 305 as shown in FIG. 4. One or more holes 400 are then formed therethrough to receive rivets or other securing device as described below. The flaps allow the cable shield to completely surround the cable opening 120 in 360 degrees.

With reference again to FIG. 3, the bracket 300 is riveted to the panel 115 with the gasket 305 and the cable shield's flaps 130a–d positioned therebetween. This compresses the gasket and the flaps against the panel 115 minimizing any openings and securing the cable shield 125 to the enclosure 100. In particular, the bracket 300 includes two securing flanges 310, 315 that extend around the perimeter of the bracket. Flange 310 secures to the first wall panel 110 (not shown) and flange 315 secures to the second wall panel 115. The flange 315 is positioned over the cable shield's first end 130 and over the gasket 305, and is secured to the second panel 115 by rivets 320. It will be appreciated one skilled in the art that the bracket 300 can be secured to the enclosure wall using a variety of methods such as welding, bonding, screwing and the like.

Illustrated in FIG. 5 is a cross-section view showing the attachment of the cable shield 125 to the enclosure wall 115. As seen in the figure, the end 130 of the cable shield 125 is folded around the gasket 305 and compressed against the wall 115 by bracket flange 315. The other panel wall 110 is secured to the wall 115 by being attached to the bracket flange 310. It should be appreciated that the flexible cable shield 125 can be attached to the enclosure wall in other ways than the illustrated embodiment. For example, the enclosure 100 can have a single panel wall and the bracket 300 would not require two flanges. Additionally, the first end 130 of the cable shield can be attached to the opposite side of the enclosure wall 115 so that the cable shield 125 passes through the opening 120. In this configuration, the cable shield's open end 135 is disposed on the opposite side of the enclosure wall 115 than the attached end 130. Additionally, the cable shield's first end 130 may be attached without being folded around the gasket 305.

Illustrated in FIG. 6 is a cross-sectional view of a plurality of cables 600 passing through the cable shield 125 and into or out of the enclosure 100. The cable shield's open end 135 is cinched closed with one or more straps 605 or other tying device. The flexibility and resiliency of the cable shield 125 allows it to closely surround the cables 600 regardless of the number of cables or their size. Closing the cable shield 125 causes the electrically conductive fabric 140, which is on the inner surface of the cable shield, to contact the cables 600 around their perimeter. Most cables have an external conductive shield surrounding it in 360 degrees. At the points of contact with the fabric 140, the cables should have 360 degrees of exposed shield to maximize conductivity. To maximize the EMI shielding ability, the far end of the cable shield on 600 should make a 360 degree electrical connection to a metallic enclosure with similar EMI shielding properties.

If an insulator is present around the cable, it should be stripped back or removed to expose the conductive shield so that contact with the conductive fabric 140 can be made. The contact creates an electrically conductive path between the cables 600, the conductive fabric 140, and the enclosure 100 which reduces electromagnetic interference from being transmitted to or from the cables and to or from the opening 120 of the enclosure 100. Reduction occurs by providing a return path for the electromagnetic currents to its source verses absorption of the energy by a ferrite or other lossy material. Optionally, an EMI absorbing material can be wrapped around the cables to provide additional shielding properties by absorbing energy. EMI absorbing material is known in the art and is, for example, material produced by Cuming Microwave Corporation.

When no cables are present, the flexible cable shield 125 can close the opening 20 in a "stand alone" product by closing it's end 135 against itself. In other words, it can plug the EMI opening 20 in a system configuration with no external cables passing through. The flexible and resilient properties of the shield 125 allow adding external cables in the future simply by opening it, installing cables, and closing it.

The present invention also provides the ability to have adjustable termination points, where a termination point is the point at which the cable shield 125 is strapped closed into contact with the cables. Since the cable shield is flexible, it can be terminated at any one or more desired points along its length (e.g. terminate it every 12 inches, but this depends on the specific application). This is advantageous because a common cable length can be installed throughout the electronic device (e.g. at least as long as the longest required length). For shorter lengths, the excess cable can be stored within an adjacent enclosure. It is convenient to have a common cable length for installation and repairs because it is easier order a single cable length than have to measure and order many different lengths.

With the present invention, configuration and installation of an EMI enclosure with cables passing therethrough is done quickly and easily. The flexible cable shield provides shielding of cables without requiring additional tools to configure the cable shield to enclose cables. The present invention provides an adjustable resilient system for enclosing any number of cables and sizes passing through the enclosure simply by collapsing and/or constricting the cable shield around the cables with a tying device. In this manner, the open end of the shield is easily configured to any size to closely surround and contact the cables. Additionally, the resilient properties of the shield allow it to be opened and closed multiple times without extensively damaging the shield.

While the present invention has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. For example, the cable shield 125 can have a single layer of material or have multiple layers of materials beyond the two layers described herein. Therefore, the invention, in its broader aspects, is not limited to the specific details, the representative apparatus, and illustrative examples shown and described. Accordingly, departures may be made from such details without departing from the spirit or scope of the applicant's general inventive concept.

We claim:

1. An enclosure comprising:
    a housing that reduces electromagnetic interference;
    an opening in the housing to allow one or more cables to pass therethrough; and
    a flexible cable shield formed as a conduit and having a first and a second end, the flexible cable shield having an inner surface formed of an electrically conductive flexible material that reduces electromagnetic interference, the first end being secured to the enclosure and enclosing the opening, the second end being adjustably collapsible to closely surround one or more cables passing therethrough causing the inner surface of the flexible cable shield to contact the one or more cables.

2. The enclosure as set forth in claim 1 wherein the housing includes at least one wall of an electrically conductive material.

3. The enclosure as set forth in claim 1 wherein the electrically conductive flexible material is a metallized fabric.

4. The enclosure as set forth in claim 3 wherein the flexible cable shield includes an outer surface bonded to the inner surface to support the inner surface.

5. The enclosure as set forth in claim 1 further including:
    a gasket positioned around the opening and in contact with the first end of the flexible cable shield; and
    a bracket positioned against the gasket and being secured to the housing causing the gasket and the first end of the flexible cable shield to be compressed against the housing.

6. The enclosure as set forth in claim 5 wherein the first end of the flexible cable shield is folded over the gasket.

7. The enclosure as set forth in claim 1 wherein the housing includes an inner side and an outer side, and the first end of the flexible cable shield being secured to the inner side and the second end of the flexible cable shield being disposed on the outer side.

8. The enclosure as set forth in claim 1 further including one or more straps for cinching the second end of the flexible cable shield.

9. An enclosure for shielding electromagnetic interference comprising:
    one or more walls configured to enclose an electronic device, the one or more walls being electrically conductive to shield electromagnetic interference;
    a cable opening formed through one wall of the one or more walls to allow one or more cables to pass through; and
    a cable conduit having a first and second end and an inner and outer surface, the first end being secured to the one wall and enclosing the cable opening, the inner surface being formed of a flexible electrically conductive material, the outer surface being formed of a flexible electrically non-conductive material, the inner and outer surfaces causing the cable conduit to be resilient where the second end is configured to be unattached and constrictable to a plurality of sizes to closely surround one or more cables minimizing electromagnetic interference.

10. The enclosure as set forth in claim 9 wherein the flexible electrically conductive material is a metallized fabric and the flexible electrically non-conductive material is a resilient cellular structured material.

11. The enclosure as set forth in claim 9 wherein the cable conduit is flexibly closeable at a plurality of points along its length.

12. The enclosure as set forth in claim 9 wherein the first end of the cable conduit includes one or more flaps that are secured to the one wall of the enclosure.

13. The enclosure as set forth in claim 12 further including a gasket disposed against the one or more flaps and being compressed against the one wall to minimize openings.

14. The enclosure as set forth in claim 9 wherein the one wall includes two panels and where the first end of the cable conduit is secured between the two panels.

15. The enclosure as set forth in claim 14 further including a bracket surrounding the first end of the cable conduit and being attached to both of the two panels, the bracket securing the first end to one of the two panels.

16. The enclosure as set forth in claim 9 wherein the inner surface of the cable conduit is bonded to the outer surface.

17. An electromagnetic interference enclosure comprising:

an electrically conductive housing; a cable opening formed in the housing to allow one or more cables to pass through;

a cable conduit enclosing the cable opening and extending out therefrom, the cable conduit being formed of a flexible and resilient material and having an unattached open end and a securing end;

an inner surface layer formed in the cable conduit being an electrically conductive fabric to reduce electromagnetic interference;

an outer surface layer formed in the cable conduit being an electrically non-conductive material that is resilient;

one or more flaps formed at the securing end of the cable conduit, the one or more flaps being secured to the housing to minimize openings therebetween, and the one or more flaps being positioned on the housing to surround the cable opening; and the cable conduit being resiliently openable and collapsible to configure the unattached open end of the cable conduit to a plurality of sizes and closely surround and contact one or more cables passing therethrough.

18. The enclosure as set forth in claim 17 wherein an electrically conductive fabric is metallized nylon.

19. The enclosure as set forth in claim 17 further including an electrically conductive bracket positioned against the one or more flaps and being secured to the housing to compress the one or more flaps against the housing.

20. The enclosure as set forth in claim 17 wherein the cable conduit is flexibly closeable at a plurality of points along its length.

* * * * *